(12) United States Patent
Ogura et al.

(10) Patent No.: US 7,227,208 B2
(45) Date of Patent: Jun. 5, 2007

(54) SOLID-STATE IMAGE PICKUP APPARATUS

(75) Inventors: Masanori Ogura, Atsugi (JP);
Fumihiro Inui, Yokohama (JP); Toru Koizumi, Yokohama (JP); Seiichiro Sakai, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/190,964

(22) Filed: Jul. 28, 2005

(65) Prior Publication Data
US 2006/0027843 A1 Feb. 9, 2006

(30) Foreign Application Priority Data
Aug. 4, 2004 (JP) ............................ 2004-228082
Jul. 13, 2005 (JP) ............................ 2005-204058

(51) Int. Cl.
*H01L 27/146* (2006.01)
*H01L 31/14* (2006.01)

(52) U.S. Cl. ...................... 257/292; 257/291; 257/233; 257/E31.097; 257/E27.131; 257/E27.132; 257/E27.133

(58) Field of Classification Search ...................... None
See application file for complete search history.

(56) References Cited

U.S. PATENT DOCUMENTS 5,291,044 A * 3/1994 Gaboury et al. ............ 257/230

| 6,407,418 | B1 * | 6/2002 | Haga et al. ................. 257/294 |
| 6,583,456 | B2 * | 6/2003 | Haga et al. ................. 257/292 |
| 7,170,042 | B2 * | 1/2007 | Kobayashi et al. ....... 250/208.1 |
| 2005/0056869 | A1 * | 3/2005 | Ichige et al. ............... 257/222 |
| 2005/0205902 | A1 * | 9/2005 | Hara et al. ................. 257/291 |
| 2005/0269604 | A1 | 12/2005 | Koizumi ..................... 257/291 |

FOREIGN PATENT DOCUMENTS

JP 2003-258229 9/2003

* cited by examiner

*Primary Examiner*—Evan Pert
*Assistant Examiner*—Victor A. Mandala, Jr.
(74) *Attorney, Agent, or Firm*—Fitzpatrick, Cella, Harper & Scinto

(57) ABSTRACT

The invention is to suppress a leak current in a photodiode and an unevenness in the leak currents. In a photoelectric converting device including a channel stop area of a higher concentration than in an element isolating insulation film formed between a photodiode, having an n-type semiconductor area formed in a p-type semiconductor, and an adjacent element, and in a p-type semiconductor layer formed under the element isolating insulation film, and a wiring layer formed in a part on the element isolating insulation film, the wiring layers on the element isolating insulation film adjacent to the photodiodes are unified in an effective area and a potential, and a p-type dark current reducing area of a higher concentration than in the channel stop area is provided in at least a part of an area opposed to the wiring layer across the element isolating insulation film.

10 Claims, 13 Drawing Sheets

SOLID-STATE IMAGE PICKUP APPARATUS

BACKGROUND OF THE INVENTION

1. Field of the Invention

The present invention relates to a solid-state image pickup apparatus, and more particularly to a solid-state image pickup apparatus adapted for use in a digital camera, a video camera, a copying apparatus, a facsimile apparatus and the like.

2. Related Background Art

An image sensor, formed by a one-dimensional or two-dimensional array of solid-state image pickup devices including photoelectric converting elements, is frequently employed in a digital camera, a video camera, a copying apparatus, a facsimile apparatus and the like. The solid-state image pickup device includes, for example, a CCD image pickup device and an amplifying solid-state image pickup device.

Recent trend in such image pickup device is toward a larger number of pixels, and a resulting decrease in the area of each pixel leads also to a decrease in the area of each photodiode. It is therefore required to handle a signal charge of a smaller amount.

FIG. 13 shows a circuit configuration of an amplifying solid-state image pickup device. In an amplifying solid-state image pickup device, a photodiode PD is provided in a unit pixel, as shown in FIG. 14. Plural transistors for reading a photosignal accumulated in the photodiode and an amplifying transistor constitute a readout circuit in a pixel.

Also in a readout circuit in a pixel shown in FIG. 3, plural transistors for reading a photosignal accumulated in a photodiode and an amplifying transistor constitute a readout circuit for two photodiodes. This circuit is to secure an area of the photodiode within a unit pixel, thereby achieving a high S/N ratio together with an increase in the number of pixels.

Also FIG. 15 shows a circuit configuration for an amplifying solid-state image pickup device in case of employing the pixel circuit configuration of FIG. 3. A basic readout operation is same in FIG. 13 and in FIG. 15. More specifically, a vertical scanning register (VSR) controls a signal readout of the pixels to a pixel row and a resetting operation, and a readout signal is accumulated in a capacitance C. The signals are outputted by a horizontal scanning register (HSR) in succession for each pixel row.

As described in Japanese Patent Application Laid-Open No. 2003-258229, FIG. 16 shows a cross-sectional structure of a photodiode in a unit pixel in an amplifying MOS sensor shown in FIG. 13. Also FIG. 17 is a plan view of a unit pixel in the CMOS sensor shown in FIG. 14.

As shown in FIG. 16, an n-type area 1803, constituting a photodiode together with a p-semiconductor layer 1802 on an n-type substrate 1801, is formed by self-alignment with a selectively oxidized film 1804 for element isolation. This structure is to maximize the area of the n-type area 1803 corresponding to the area of the photodiode, to a limit.

Under the selectively oxidized film 1804 of element isolation structure, there are formed a source-drain area 1807 of an adjacent MOS transistor, and a channel stop area 1806 for improving a punch-through voltage to the n-type area 1803 of the photodiode. Also on the selectively oxidized film 1804 for element isolation, a gate wiring layer 1805 of a transistor is formed.

FIG. 5 is a plan view of the unit pixel shown in FIG. 3, and FIG. 1 shows a cross section of FIG. 5. Referring to FIG. 1, an n-type area 103, constituting a photodiode together with an n-semiconductor layer 102 on an n-type substrate 101, is formed by self-alignment with a selectively oxidized film 104 for element isolation. This structure is to maximize the area of the n-type area 103 corresponding to the area of the photodiode, to a limit.

Under the selectively oxidized film 104 for element isolation, there are formed a source-drain area 107 of an adjacent MOS transistor, and a channel stop area 106 for improving a punch-through voltage to the n-type area 103 of the photodiode. Also on the selectively oxidized film 104 for element isolation, a gate wiring layer 105 for a transistor is formed.

In FIG. 16 (or FIG. 1), however, when a high-level potential (for example +5 V) is applied to the gate wiring layer 1805 (105) of the transistor, an effective concentration is lowered in the p-type channel stop area thereunder. Therefore, a minority carrier concentration increases in a lower part of the selectively oxidized film 1804 (104).

Such minority carriers (electrons) diffuse into the photodiode to result in a drawback of an increased dark current of the photodiode.

As a countermeasure against such phenomenon, it is conceivable to increase the concentration in the p-type channel stop area 1806 (106), but such measure results in a drawback of a lowered junction breakdown voltage to the adjacent $n^{++}$ source-drain area 1807 (107) or an increased leak current through the junction.

Also it is conceivable to increase a thickness of the selectively oxidized film 1804 (104) for element isolation, formed by a selective oxidation, but, in such case, the wiring layer 1805 (105) shows a drawback of an increased step difference, which is unsuitable for forming fine wirings and tends to cause a breakage or a shortcircuiting of wirings.

Thus, an increase in the dark current may lead to an increase in noises and a deterioration of S/N ratio.

In Particular problems arise in a semiconductor solid-state image pickup device as shown in FIG. 15, utilizing a pixel configuration shown in FIG. 3. In such device, there is constructed, for two photodiodes, a readout circuit by plural transistors Tr for reading photosignals accumulated in the photodiodes and an amplifying transistor. Therefore, because of an asymmetry in the arrangements of readout circuits for the photodiodes, different dark currents flow into the photodiodes of n-th row and (n+1)th row, thus resulting a drawback of different S/N ratios between the rows.

SUMMARY OF THE INVENTION

In consideration of the foregoing, an object of the present invention is to provide a photoelectric converting device and a solid-state image pickup apparatus capable of achieving a reduced leak current and an improved uniformity of the leak current, and having a high and uniform S/N ratio.

The aforementioned object can be attained, according to the present invention, by a solid-state image pickup apparatus having a pixel configuration including plural photodiodes and plural transistors and provided with a plurality of such pixels, wherein:

the plural transistors include plural transfer transistors for respectively transferring signals from the plural photodiodes, a reset transistor for resetting the plural photodiodes, an amplifying transistor for converting the signal, transferred by the transfer transistors, into a voltage, and a selecting transistor for connecting output of the amplifying transistor to a common output line;

gates and wirings to the gates in at least two of the reset transistor, the amplifying transistor and the selecting transistor are adjacent to any one of the plural photodiodes; and the gate and the wiring to the gate in each of the transistors, adjacent to the photodiodes, have a same sum of length.

Also the present invention provides a solid-state image pickup apparatus having a pixel configuration including two photodiodes and plural transistors and provided with a plurality of such pixels, wherein:

in each pixel, a first transistor adjacent to a first photodiode performs a function of resetting the photodiode and a signal readout path;

a second transistor adjacent to a second photodiode performs a function of selecting a row;

a gate and a wiring in each of the first and second transistors respectively adjacent to the photodiodes have a same effective length; and the gate and the wiring in each of the first and second transistors respectively adjacent to the photodiodes have a same potential during an accumulation period.

The present invention is further characterized in including a plurality of pixels each having two photodiodes, two transfer transistors for respectively transferring signals from the two photodiodes, a reset transistor for resetting the two photodiodes, an amplifying transistor for converting the transferred signal into a voltage, and a selecting transistor for connecting output of the amplifier to a common output line, wherein a dark current reducing area of a pixel area is formed in an entire area excluding a source-drain area and a gate area of the transistor and a part of the photodiodes.

The present invention allows, as described before, to reduce a leak current of a photoelectric converting device and to improve uniformity of the leak current, thereby providing a photoelectric converting device and a solid-state image pickup apparatus having a high and uniform S/N ratio, solid-state image pickup apparatus having a pixel configuration including plural photodiodes and plural transistors and provided with a plurality of such pixels, wherein:

the plural transistors include plural transfer transistors for respectively transferring signals from the plural photodiodes, a reset transistor for resetting the plural photodiodes, an amplifying transistor for converting the signal, transferred by the transfer transistors, into a voltage, and a selecting transistor for connecting output of the amplifying transistor to a common output line;

gates and wirings to the gates in at least two of the reset transistor, the amplifying transistor and the selecting transistor are adjacent to any one of the plural photodiodes; and the gate and the wiring to the gate in each of the transistors, adjacent to the photodiodes, have a same sum of length.

Also the present invention provides a solid-state image pickup apparatus having a pixel configuration including two photodiodes and plural transistors and provided with a plurality of such pixels, wherein:

in each pixel, a first transistor adjacent to a first photodiode performs a function of resetting the photodiode and a signal readout path;

a second transistor adjacent to a second photodiode performs a function of selecting a row;

a gate and a wiring in each of the first and second transistors respectively adjacent to the photodiodes have a same effective length; and the gate and the wiring in each of the first and second transistors respectively adjacent to the photodiodes have a same potential during an accumulation period.

The present invention is further characterized in including a plurality of pixels each having two photodiodes, two transfer transistors for respectively transferring signals from the two photodiodes, a reset transistor for resetting the two photodiodes, an amplifying transistor for converting the transferred signal into a voltage, and a selecting transistor for connecting output of the amplifier to a common output line, wherein a dark current reducing area of a pixel area is formed in an entire area excluding a source-drain area and a gate area of the transistor and a part of the photodiodes.

The present invention allows, as described before, to reduce a leak current of a photoelectric converting device and to improve uniformity of the leak current, thereby providing a photoelectric converting device and a solid-state image pickup apparatus having a high and uniform S/N ratio.

DETAILED DESCRIPTION OF THE PREFERRED EMBODIMENTS

In the following, preferred embodiments for executing the present invention will be explained with reference to the accompanying drawings. The present invention is applicable to any semiconductor apparatus, but a photoelectric converting device and an image pickup apparatus will be explained as examples.

First Embodiment

Figure 1:
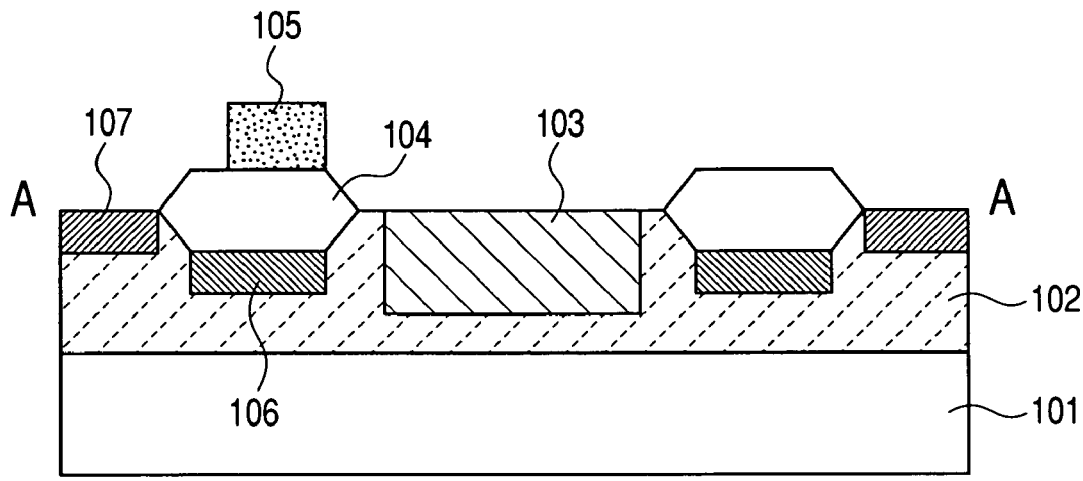
FIG. 1 is a cross-sectional view showing a first embodiment of the present invention.
Figure 2:
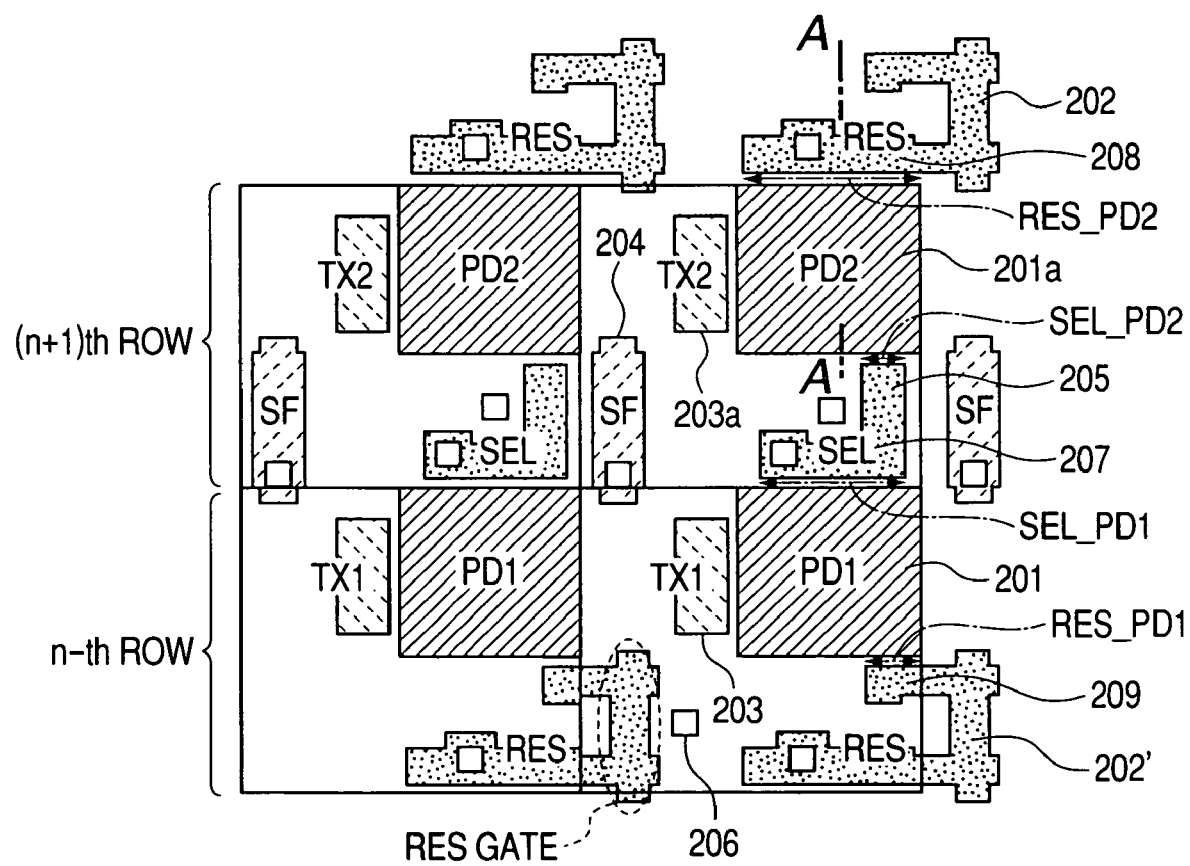
FIG. 2 is a plan view showing a first embodiment of the present invention.
Figure 3:
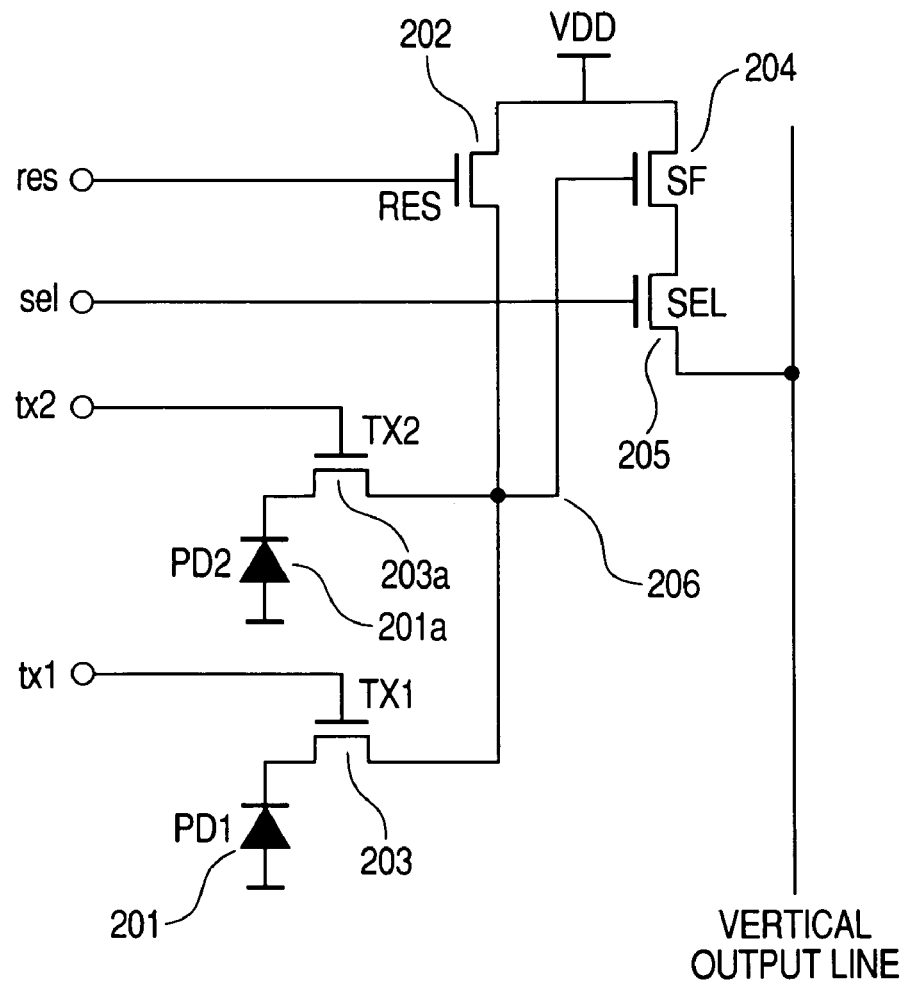
FIG. 3 is an equivalent circuit diagram for explaining first, second, third and fourth embodiments of the present invention and a prior technology.

FIGS. 1, 2 and 3 respectively show a cross-sectional view and a plan view of a first embodiment of a solid-state image pickup apparatus and an equivalent circuit diagram of a photoelectric converting apparatus, as an embodiment of the present invention.

Referring to FIG. 1, there are shown a semiconductor substrate 101 for example of n-type, a p-type semiconductor layer 102, and a photodiode 103 serving as a photoelectric converting device, formed in combination with the n-semiconductor area.

There are also shown an element isolating insulation film 104, a wiring layer 105, and a p-type channel stop area 106 formed under the element isolating insulation film 104.

There is also provided a source-drain area 107 of an adjacent MOS transistor.

In the following, a circuit configuration will be explained with reference to FIGS. 2 and 3. FIG. 1 is a cross-sectional view along a line A—A in FIG. 2.

Referring to FIGS. 2 and 3, there are shown photodiodes 201, 201a for photoelectric conversion (201a in FIG. 2 corresponding to the n-semiconductor area 103 in FIG. 1), a reset transistor 202 for resetting the photodiode 201 and a floating diffusion (FD) area 206, and transfer MOS transistors 203, 203a for reading signal charges of the photodiodes 201, 201a, and a source follower amplifier (MOS transistor) 204 for converting the read charge into a voltage, connected with the FD area 206.

A row selecting MOS transistor 205 connects the output of the source follower amplifier to a signal line.

The signal charges from the photodiodes 201, 201a are transferred, through the transfer MOS transistors 203, 203a, to the floating diffusion (FD) area 206, and entered into a gate of the source follower amplifier (MOS transistor) 204 connected with the FD area 206.

Then the signal, converted into a voltage by the source follower amplifier (MOS transistor) 204, is outputted through the row selecting MOS transistor 205.

In FIG. 2, a square mark indicates a contact hole.

For resetting the photodiodes 201, 201a shown in FIG. 3, the reset MOS transistor 202 and the transfer MOS transistors 203, 203a are turned on, thereby resetting the photodiodes 201, 201a.

Thereafter, the transfer MOS transistors 203, 203a are turned off, whereupon the photodiodes 201, 201a enter an accumulating state.

After the lapse of an accumulation time ts, the reset MOS transistor 202 is turned off, and a MOS transistor 205 only corresponding to a row selected for readout is turned on to activate the source follower amplifier 204. Then, in such state, the transfer MOS transistors 203, 203a are turned on to read out the signal charges of the photodiodes 201, 201a.

Referring to FIG. 2, lengths of gates and wirings to the gates of the MOS transistor 202, 202' and 205 adjacent to the photodiodes 201 (PD1) and 201a (PD2) effectively satisfy a following condition:

$$(RES\_PD1)+(SEL\_PD1)=(RES\_PD2)+(SEL\_PD2).$$

In the accumulation state, both are in high-level states (condition 1).

Also with respect to a position of a center of gravity of SF and RES, the photodiodes PD2 and PD1 have a same position of a center of gravity, both of which are in a high-level state in the accumulation state (condition 2).

In the accumulation state, the impurity diffusion area FD 206 assumes a high-level state in which a VDD, for example a DC voltage of +5 V is applied for preventing a current leak. For example in FIG. 2, gates of the MOS transistor 204 (SF) and the reset MOS transistors 202, 202' and the signal lines 105 to the gates are in a high-level state.

Besides, in the present embodiment, the gate and the wiring to the gate of the MOS transistor 205 are maintained in a high-level state.

In this manner, all the gates and the wirings to the gates are maintained at a high-level potential, excluding two gates of 201, 201a and wirings thereto.

In such state, under the gates and the wirings thereto, the p-type channel step area 106 shows an effective decrease in the concentration, whereby the concentration of the minority carriers may become higher, in comparison with an area where the wiring layer 105 is absent thereon or the wiring layer is present thereon but assumes a low-level potential.

The generated minority carriers diffuse in the photodiodes 201, 201a, and numbers of flowing electrons (dark currents) into 201 and 201a become substantially same owing to the conditions 1 and 2.

For example in case the gate of the MOS transistor 205' and the signal line 207 to the gate alone are at the low-level potential, the minority carriers are not easily generated under the gate of the MOS transistor 205 and the signal line 207 thereto. Therefore a dark current of the photodiode 201 from the transistor 205 is reduced, while a dark current of the photodiode 201a from the transistor 202 and the wiring 208 to the gate. Consequently, the S/N ratio becomes different between the rows. The wirings 207 and 208 correspond to 105.

In the present embodiment, in order to secure areas of photodiodes, a readout circuit is constituted, for two photodiodes, of plural transistors for reading photosignals accumulated in the photodiodes and an amplifying transistor. In such configuration, because of an asymmetry in the arrangement of the readout circuit to the photodiodes, the dark currents flowing into the photodiodes are different between n-th row and (n+1)th row, thereby resulting in a drawback that the S/N ratio is different between the rows. In the present embodiment, effective lengths and potentials in the, accumulation state are made uniform in the MOS transistor 202, 205, 202' and wirings 207, 208, 209 to the gates, adjacent to the photodiode in n-th row (201 in the present embodiment) and the photodiode in (n+1)th row (201a in the present embodiment) (based on the conditions 1, 2). Thus the flowing minority carriers (dark currents) into the photodiodes of n-th row and (n+1)th row are made uniform to resolve the unevenness in the S/N ratio by the dark currents.

In the present embodiment, however, a gate and a wiring to the gate are provided adjacent to the photodiode of n-th row, and a dark current is increased to suppress the unevenness in the dark currents in the n-th row and the (n+1)th row. It is therefore associated with a drawback that the S/N ratio is deteriorated for the entire pixel.

Also such structure may be applied to an embedded photodiode in which a p$^+$ layer is formed on an n-semiconductor area 103 of the photodiode.

Also it is preferable that the condition 1 is completely satisfied, but it is verified that an aberattion of ±10% is practically acceptable for image formation, as represented by:

$$[(RES\_PD1)+(SEL\_PD1)]/[(RES\_PD2)+(SEL\_PD2)]=0.9–1$$

In the present specification, such structural condition is represented by an expression "effective length being equal".

Second Embodiment

Figure 4:
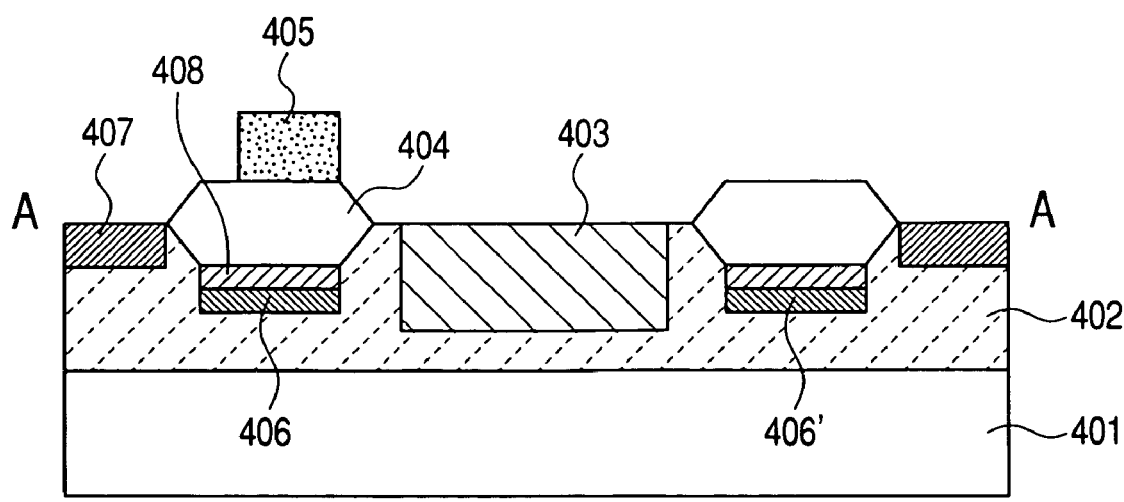
FIG. 4 is a cross-sectional view showing a second embodiment of the present invention.
Figure 5:
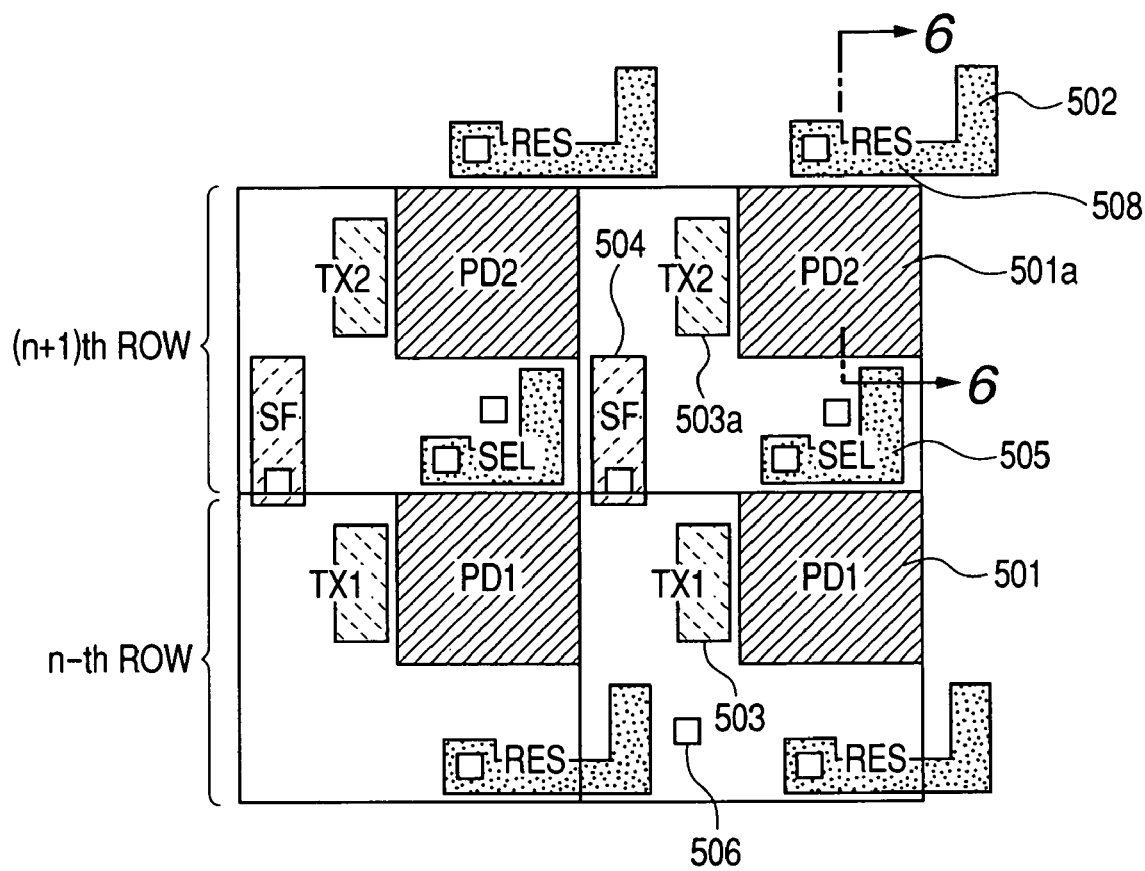
FIG. 5 is a plan view for explaining a second embodiment of the present invention and a prior technology.

FIGS. 4 and 5 are respectively a cross-sectional view and a plan view of a photoelectric converting apparatus in a second embodiment of the solid-state image pickup apparatus of the invention. An equivalent circuit is same as that of the first embodiment shown in FIG. 3.

Referring to FIG. 4, there are shown a semiconductor substrate 401 for example of n-type, a p-type semiconductor layer 402, a photodiode 403 serving as a photoelectric converting device, formed in combination with the n-semiconductor area, an element isolating insulation film 404, a wiring layer 405, a p-type channel stop area 406 formed under the element isolating insulation film 404, a source-drain area 407 of an adjacent MOS transistor, and a $p^+$ dark current reducing area 408 having a concentration higher than that in the channel stop area 406.

In the following, a circuit configuration will be explained with reference to FIG. 5. FIG. 4 is a cross-sectional view along a line 6—6 in FIG. 5.

Referring to FIG. 5, there are provided photodiodes 501, 501a for photoelectric conversion (501a in FIG. 5 corresponding to the n-semiconductor area 403 in FIG. 4), a reset transistor 502 for resetting the photodiode 501 and a floating diffusion (FD) area 506, transfer MOS transistors 503, 503a for reading signal charges of the photodiodes 501, 501a, and a source follower amplifier (MOS transistor) 504 for converting the read charge into a voltage, connected with the FD area 206.

A row selecting MOS transistor 505 connects the output of the source follower amplifier to a signal line. The signal charges from the photodiodes 501, 501a are transferred, through the transfer MOS transistors 503, 503a, to the floating diffusion (FD) area 506, and entered into a gate of the source follower amplifier (MOS transistor) 504 connected with the FD area 506.

Then the signal, converted into a voltage by the source follower amplifier (MOS transistor) 504, is outputted through the row selecting MOS transistor 505. In FIG. 5, a square mark indicates a contact hole.

For resetting the photodiodes 501, 501a shown in FIG. 5, the reset MOS transistor 502 and the transfer MOS transistors 503, 503a are turned on, thereby resetting the photodiodes 501, 501a. Thereafter, the transfer MOS transistors 503, 503a are turned off.

Starting from this point, the photodiodes 501, 501a enter an accumulating state. After the lapse of an accumulation time ts, the reset MOS transistor 502 is turned off, and the selecting MOS transistor 505 is turned on to activate the source follower amplifier 504. Then, in such state, the transfer MOS transistors 503, 503a are turned on to read out the signal charges of the photodiodes 501, 501a.

In the accumulation state, the impurity diffusion area FD 506 assumes a high-level state in which a VDD, for example a DC voltage of +5 V is applied for preventing a current leak. The two gates of the MOS transistor 404 and the reset MOS transistors 502 in FIG. 5 are in a high-level state. Also in FIG. 4, gates of the MOS transistor 504 and the reset MOS transistor 502 and the wiring 508 to the gate assume a high-level potential state. The wiring 508 corresponds to 405.

In this state, under the wiring layer 405, the p-type channel stop area 406 shows an effective decrease of the concentration, thereby resulting in an increase in the concentration of the minority carriers, in comparison with an area 406 where the wiring layer 405 is absent thereon or an area where the wiring layer is present thereon but assumes a low-level potential.

In case the dark current reducing area 408 is absent, the generated minority carriers flow into the photodiode 501a, while the minority carriers do not flow into the photodiode 501 having an adjacent low-level gate. Therefore the dark currents of the photodiodes 501, 501a become uneven, thereby deteriorating the uniformity of the S/N ratio.

The dark current reducing area 408 formed under the wiring layer 405, even in a state where the minority carriers are generated under the wiring layer 405, provides an effect of suppressing the concentration of the minority carriers and suppressing the unevenness of S/N ratio between the pixels.

It can also suppress the dark current itself, in addition to the suppression of the unevenness in the dark currents in the photodiodes 501, 501a of the pixel, thereby providing a high S/N ratio.

Also the area 408 can be effective even in a part immediately under the wiring layer 405. In the present embodiment, however, the dark current reducing area 408 is formed also in an area not having the wiring layer 405 thereon as shown in FIG. 4, without any difficulty. It may also be formed in an area where the wiring layer 405 assumes a low-level state during the accumulation period, and also a shape extended toward the photodiode as shown in FIG. 6 can provide a high S/N ratio.

Figure 6:
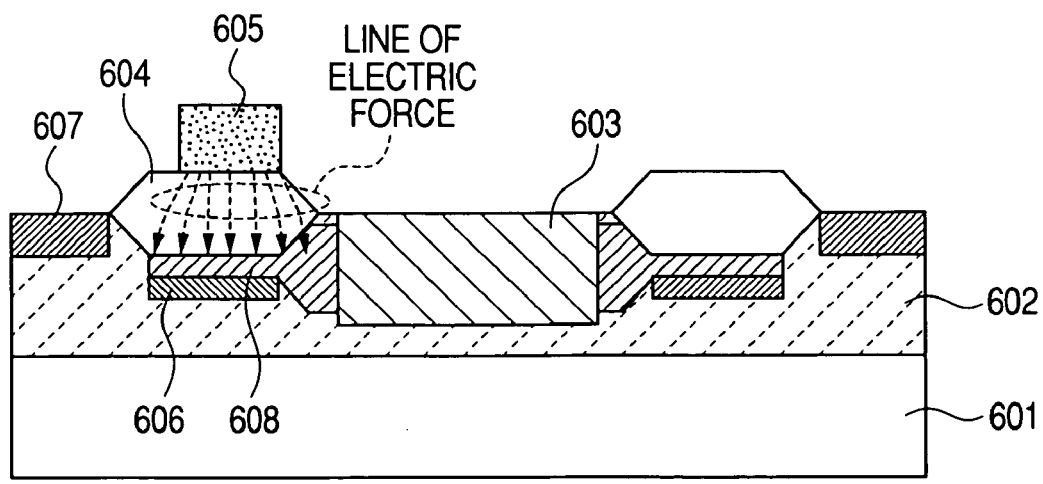
FIG. 6 is a cross-sectional view showing second and third embodiments of the present invention.

This is because the dark current reducing area 608 includes, as shown in FIG. 6, an area immediately under the wiring layer 605, or because the dark current reducing area 608 has a shape extended toward the photodiode, as shown in FIG. 6. In such shape, within line of electric force generated toward the substrate at a high-level potential of the wiring layer 605, the lines of electric force generated at both ends of the wiring layer 605 and expanding in the horizontal direction are terminated in the p-channel stop area 608. In this manner the dark current reducing area 608 can suppress the increase of the minority carriers.

An increase in the concentration of the dark current reducing area 408 can reduce the number of the minority carriers generated under the wiring layer 405. However, such dark current reducing area 408 forms a dense PN junction with an adjacent $n^{++}$ area (for example a source-drain area of an NMOS transistor), thereby resulting in a leak current or a reduced breakdown voltage. Therefore, it is impractical to form a dark current reducing area 408 of an excessive concentration, and it has not been possible to completely suppress the unevenness in the dark currents and the S/N ratio between the n-th and (n+1)th rows.

However, in comparison with the first embodiment, the dark current reducing area 408 can reduce the absolute value of the dark current without increasing the dark current in the n-th row, thereby providing a high S/N ratio in the entire pixel.

In the present embodiment, the dark current reducing area 408 can be effective as long as a concentration thereof is higher than that of the p-channel stop area 406, though it is dependent on a thickness and a specific dielectric constant of the element isolating insulation film 404, a work function of the material constituting the wiring layer 405 and the like.

Preferably, a minority carrier concentration $Np1$ of the p-channel stop area 406' and a minority carrier concentration $Np2$ of the dark current reducing area 408 in a high-level state of the wiring layer 405 satisfy a relationship $Np1=Np2$.

For example, let us consider a case where the substrate is constituted of silicon (Si), the p-channel stop area 406' has a majority carrier concentration of $1E17/cm^3$ and the element isolating insulation film is constituted of silicon dioxide ($SiO_2$) with a thickness of 0.5 μm. In such case, the p-type layer of the dark current reducing area 408 preferably has a majority carrier concentration of about $3E17/cm^3$.

Also a relation to the $n_{++}$ area constituting a part of the floating diffusion area 506 for holding the photocharge is particularly important. Between the dark current reducing area 608 and the source-drain area 608 in FIG. 6, it is more preferable to position a p-channel stop area 606 or to form a p-type layer of a concentration lower than that of the dark current reducing area 608. A distance between the source-drain area 607 and the dark current reducing area 608 is preferably 0.2 μm or larger, more preferably 0.3 to 0.4 μm.

Also such structure is applicable also to an embedded photodiode having a $p^+$ layer on the n-semiconductor area 403 or 603 of the photodiode.

Third Embodiment

Figure 7:
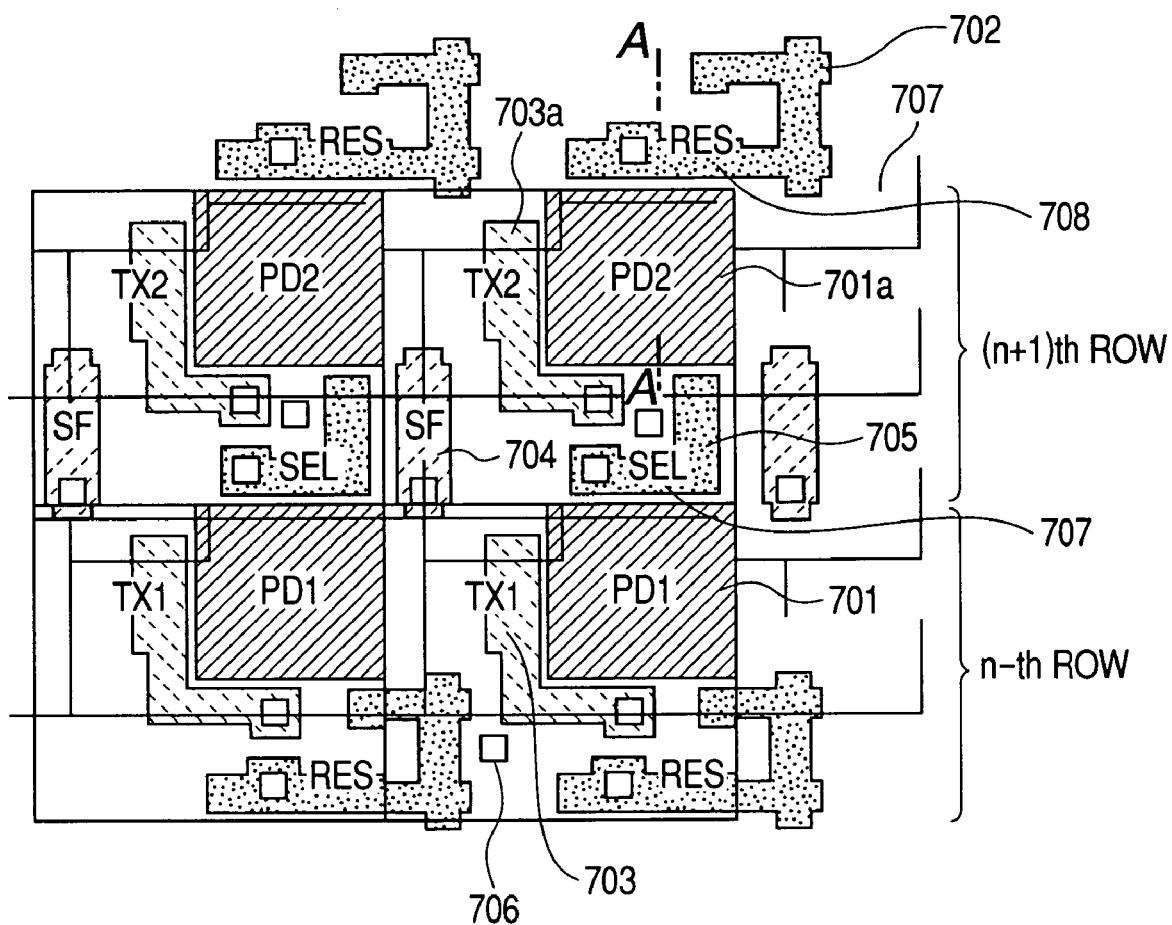
FIG. 7 is a plan view showing a third embodiment of the present invention.

FIGS. 6 and 7 are respectively a cross-sectional view and a plan view of a third embodiment of the solid-state image pickup apparatus of the invention. An equivalent circuit is same as that of the first embodiment shown in FIG. 3.

Referring to FIG. 6, there are shown a semiconductor substrate 601 for example of n-type, a p-type semiconductor layer 602, a photodiode 603 serving as a photoelectric converting device, formed in combination with the n-semiconductor area, an element isolating insulation film 604, a wiring layer 605, a p-type channel stop area 606 formed under the element isolating insulation film 604, a source-drain area 607 of an adjacent MOS transistor, and a $p^+$ dark current reducing area 608 having a concentration higher than that in the channel stop area 606.

In the following, a circuit configuration will be explained with reference to FIG. 7. FIG. 6 is a cross-sectional view along a line A—A in FIG. 7.

Referring to FIG. 7, there are provided a photodiode 701 for photoelectric conversion (701a in FIG. 7 corresponding to an n-semiconductor in FIG. 6), a reset transistor 702 for resetting the photodiodes 701, 701a and a floating diffusion (FD) area 706, transfer MOS transistors 703, 703a for reading signal charges of the photodiodes 701, 701a, and a source follower amplifier (MOS transistor) 704 for converting the read charge into a voltage, connected with the FD area 706.

A row selecting MOS transistor 705 connects the output of the source follower amplifier to a signal line.

The signal charges from the photodiodes 701, 701a are transferred, through the transfer MOS transistors 703, 703a, to the floating diffusion (FD) area 706, and entered into a gate of the source follower amplifier (MOS transistor) 704 connected with the FD area '06.

Then the signal, converted into a voltage by the source follower amplifier (MOS transistor) 704, is outputted through the row selecting MOS transistor 705.

In FIG. 7, a square mark indicates a contact hole. For resetting the photodiodes 701, 701a shown in FIG. 7, the reset MOS transistor 702 and the transfer MOS transistors 703, 703a are turned on, thereby resetting the photodiodes 701, 701a.

Thereafter, the transfer MOS transistors 703, 703a are turned off. Starting from this point, the photodiodes 701, 701a enter an accumulating state.

After the lapse of an accumulation time ts, the reset MOS transistor 702 is turned off, and the selecting MOS transistor 705 is turned on. In thus activated state of the source follower amplifier 7, the transfer MOS transistors 703, 703a are turned on to read out the signal charges of the photodiodes 701, 701a.

A dark current reducing area 707, corresponding to 608 in FIG. 6, is formed, within a pixel, under peripheral portions of the photodiodes 701, 701a and immediately under the element isolating insulation film.

In the accumulation state, the impurity diffusion area FD 706 assumes a high-level state in which a VDD, for example a DC voltage of +5 V is applied for preventing a current leak. The two gates of the MOS transistor 704 and the reset MOS transistors 702 in FIG. 7 are in a high-level state. Also in FIG. 6, gates of the MOS transistor 704 and the reset MOS transistor 702 and the wiring 708 to the gate assume a high-level potential state.

Also in the present embodiment, the gate of the MOS transistor 705 and a wiring 707 to the gate are maintained at a high-level potential state. The wirings 707 and 708 corresponds to 605.

In this manner, the gates and the wirings to the gates are all maintained at the high-level potential state, except for the gates and the wirings thereto in the photodiodes 701, 701a.

In this state, under the wiring layer 605 (under 707 and 708 in FIG. 7), the p-type channel stop area 606 shows an effective decrease of the concentration. Also there results an increase in the concentration of the minority carriers, in comparison with an area 606 where the wiring layer 605 is absent thereon or an area where the wiring layer is present thereon but assumes a low-level potential. Therefore, the generated minority carriers uniformly flow into the photodiodes 710, 701a, thus resulting in approximate same dark currents therein (based on the conditions 1 and 2 in the second embodiment).

In case the dark current reducing area 608 is absent, the generated minority carriers diffuse into the photodiode 701a. In the present embodiment, a dark current reducing area is formed between the photodiodes 701, 701a and the gates and the wirings 702, 705 thereof of a high-level state adjacent thereto. Consequently, the minority carriers generated under the wirings 707, 708 flow, after a reduction, uniformly into the photodiodes 701, 701a (based on the conditions 1 and 2 of the second embodiment).

Therefore the photodiodes 701, 701a show low and uniform dark currents, thus providing a high and uniform S/N ratio.

In the present embodiment, the dark current reducing area 608 is given such a p-type impurity concentration as not to cause a current leak or a deterioration of the breakdown voltage at a PN junction with an adjacent $n^{++}$ area. Also, even in case the dark current cannot be completely suppressed by the dark current reducing area 608, the gate 702 and the wiring thereto, and the gate 705 and the wiring thereto, respectively corresponding to the photodiodes 701 and 701A, are maintained same in an effective length or an effective area, and in a potential. In this manner, the dark currents generated under the wirings 702, 705 are reduced to an acceptable level and uniformly flow into the photodiodes 701, 701a.

In this manner it is rendered possible to obtain an S/N ratio higher than in the first embodiment and more uniform than in the second embodiment.

Also such structure is applicable also to an embedded photodiode having a $p^+$ layer on a surface of the n-semiconductor area 603 of the photodiode.

Also it is preferable that the condition 1 is completely satisfied, but it is verified that an aberration of ±10% is practically acceptable for image formation, as represented by:

[(RES_PD1)+(SEL_PD1)]/[(RES_PD2)+(SEL_PD2)]=

0.9–1.1. In the present specification, such structural condition is represented by an expression "effective length being equal".

Fourth Embodiment

Figure 8:
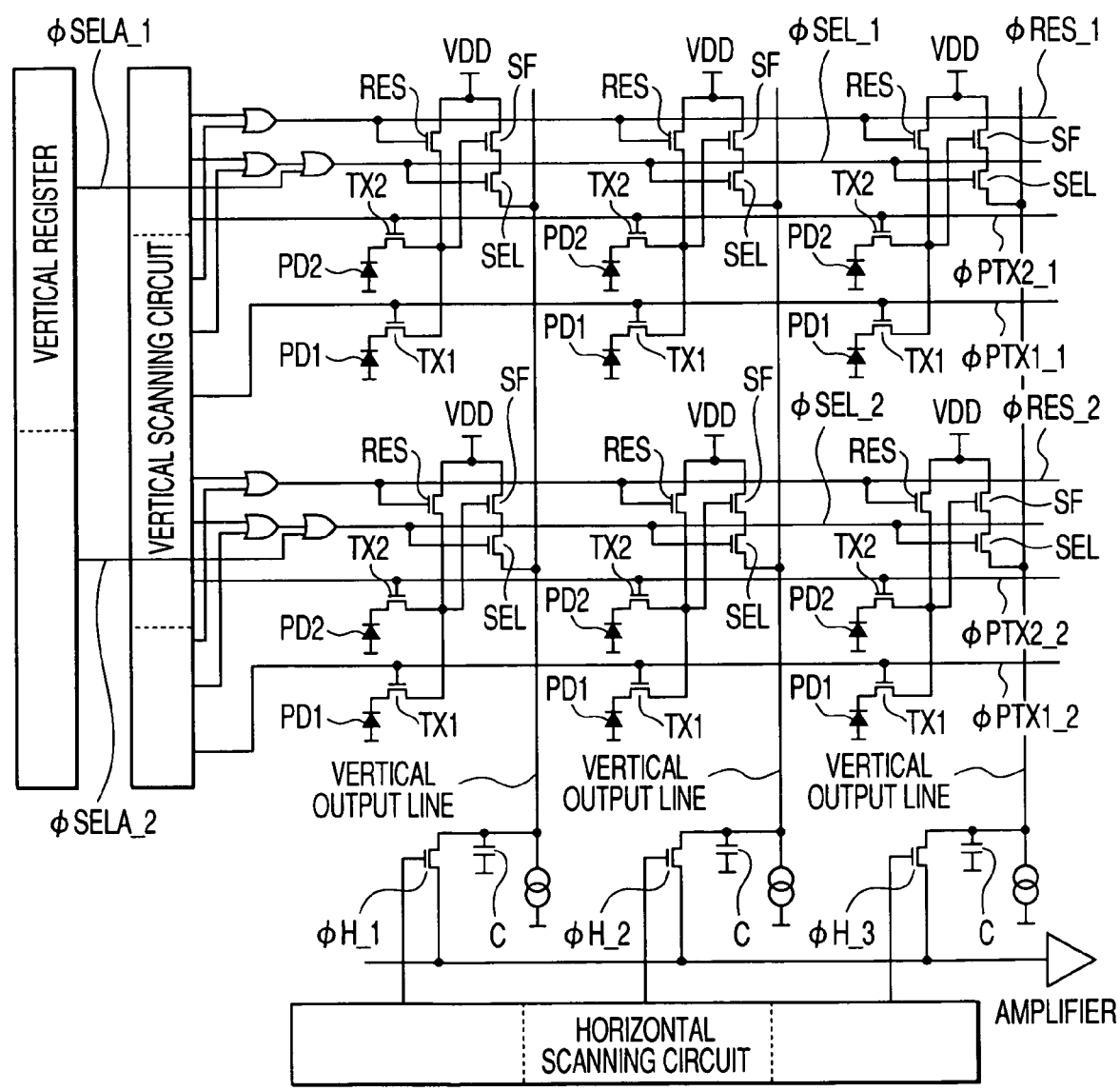
FIG. 8 is an equivalent circuit diagram showing a fourth embodiment of the present invention.
Figure 9:
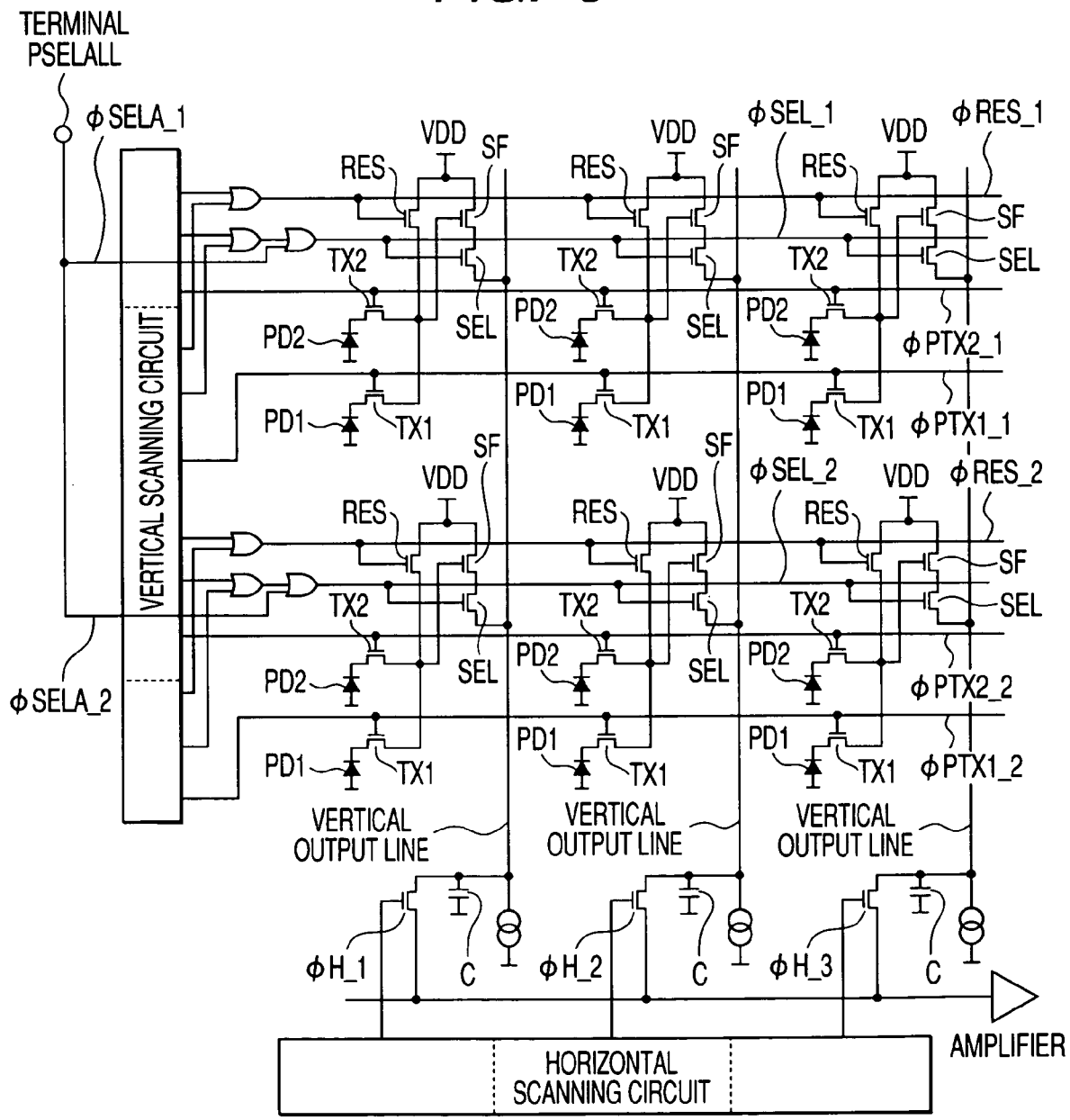
FIG. 9 is an equivalent circuit diagram showing a fourth embodiment of the present invention.
Figure 10:
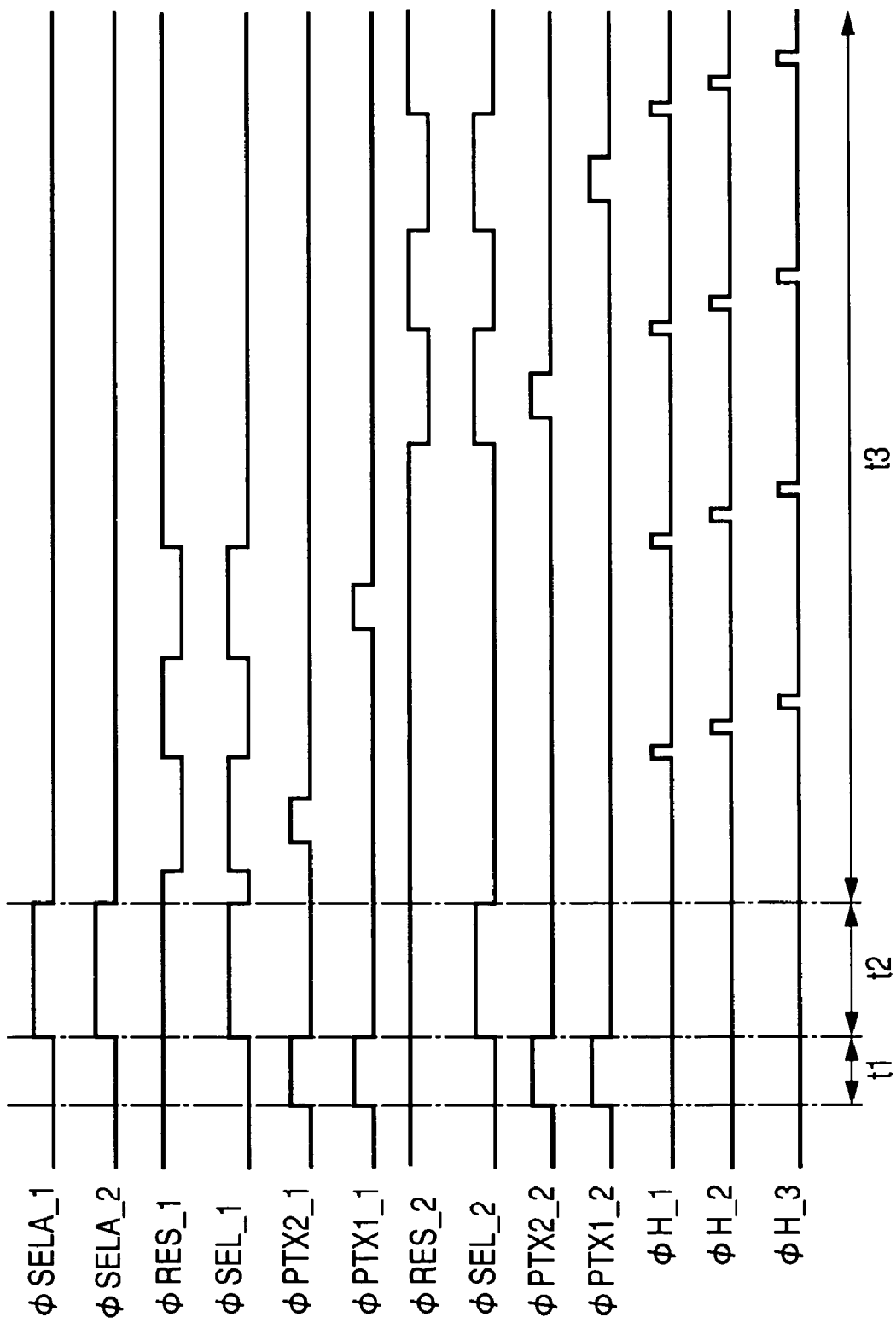
FIG. 10 is a timing chart for explaining a fourth embodiment of the present invention.

FIGS. 8, 9 and 10 show a specific circuit configuration to a signal readout and a timing of signal readout, in the first and third embodiments.

In an accumulation state of the first, second or third embodiment, the gate of the reset MOS transistor is maintained at a high-level state to apply a DC voltage VDD to the floating diffusion area (FD). Therefore the gate of the source follower amplifier SF, connected to the FD area, is at a high-level state.

The operation to this point is same as in a prior drive method, but, in a configuration shown in FIG. 8, a vertical register is provided in addition to a vertical scanning register and a horizontal scanning register constituting the normal driving circuit (scanning circuit).

Now reference is made to FIG. 10 for explaining a function of the vertical register. At first, at t1, the gate of the reset MOS transistor RES and the gate of the transfer MOS transistor TX for transferring the charge from the photodiodes PD to the floating diffusion area FD are shifted to a high-level state, thereby resetting the charges remaining in the floating diffusion areas FD and the photodiodes PD in the pixels of all the rows and columns.

Thereafter, the gate of the transfer MOS transistor TX is shifted to a low-level state to initiate an accumulation state t2. The accumulation state t2 corresponds, in an image pickup system (such as a camera), to a state where a shutter is opened to expose the solid-state image pickup apparatus.

In t2, a memory bit output of the vertical register is shifted to a high-level state, thereby setting the gates of the row selecting switches SEL of all the rows and columns, at the high-level state.

In a readout period t3, the vertical register is reset to shift the bit output thereof to a low-level state, thereby setting gates of all the row selecting switches SEL once at a low-level state. Thereafter all the rows are scanned by setting the gate of the row selecting switch SEL is set at a high-level state one by one according to the order of readout.

The present embodiment relates to an operation of the vertical register in the period t2. It is possible, in the vertical scanning circuit including a control circuit for the transfer MOS transistors TX and the reset MOS transistors RES, to write successive data in all the bits in such a manner that the gates of the row selecting MOS transistors assume high-level states. However, such operation results in a complication of the operation sequence, or, by writing successive data so as to set the gates of the MOS transistors SEL of all the rows at the high-level state after the resetting in t1, the period of the high-level state the gate of the MOS transistor SEL becomes different among the pixels.

Therefore, the dark currents in the pixels becomes considerably uneven among the rows.

The vertical register of the present embodiment, by a driving method of setting the gates of the MOS transistors SEL of all the rows in t2, allows to improve the uniformity of the dark currents in the pixels, in comparison with the first or third embodiment.

Also in the present embodiment, φSELA_1 and φSELA_2 are connected to the output of the vertical register, but it is also possible, as shown in FIG. 9, to provide a terminal PSEALL and to control the SEL gates of all the rows and the columns by an external pulse. Such drive can be achieved by simply setting PSEAL=high during the period t2.

Fifth Embodiment

A fifth embodiment will be explained with reference to FIGS. 11 and 12.

Figure 11:
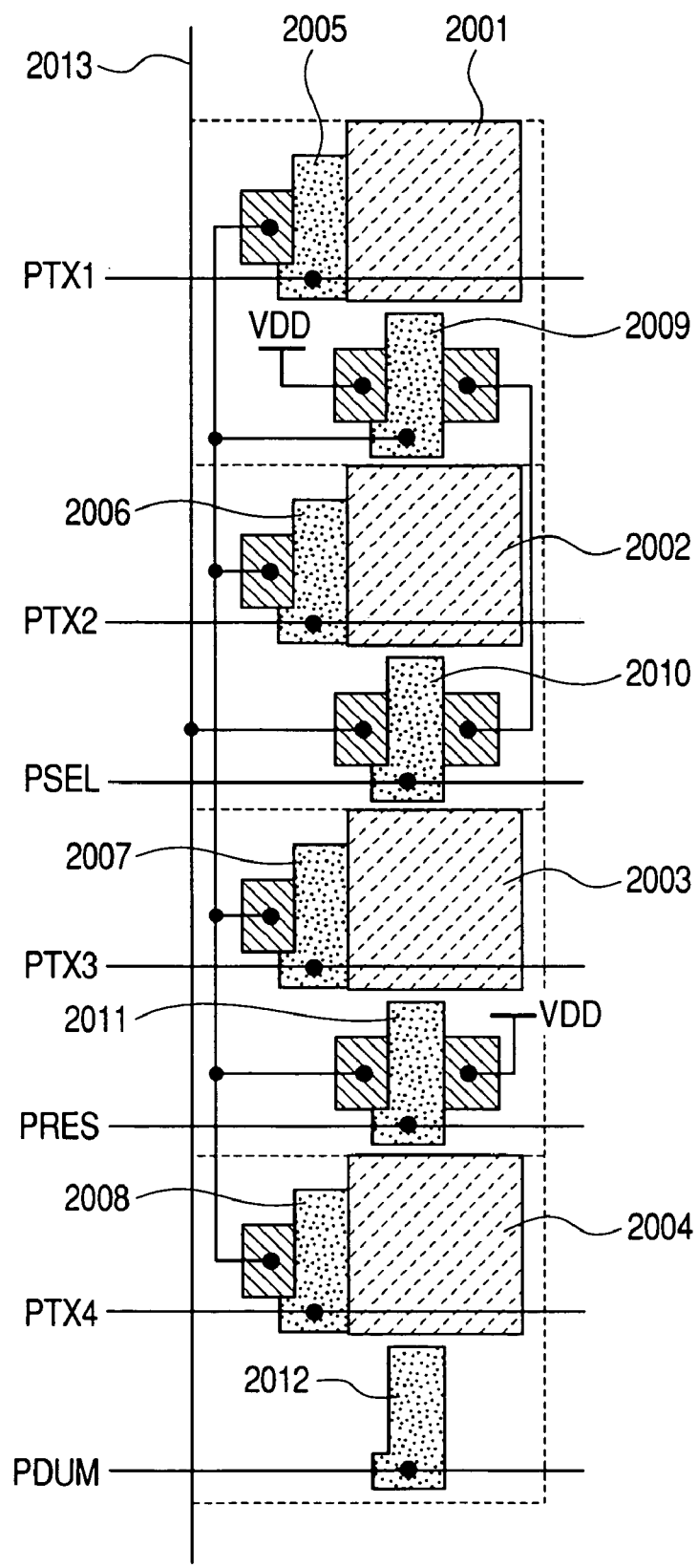
FIG. 11 is a schematic view showing a fifth embodiment of the present invention.
Figure 12:
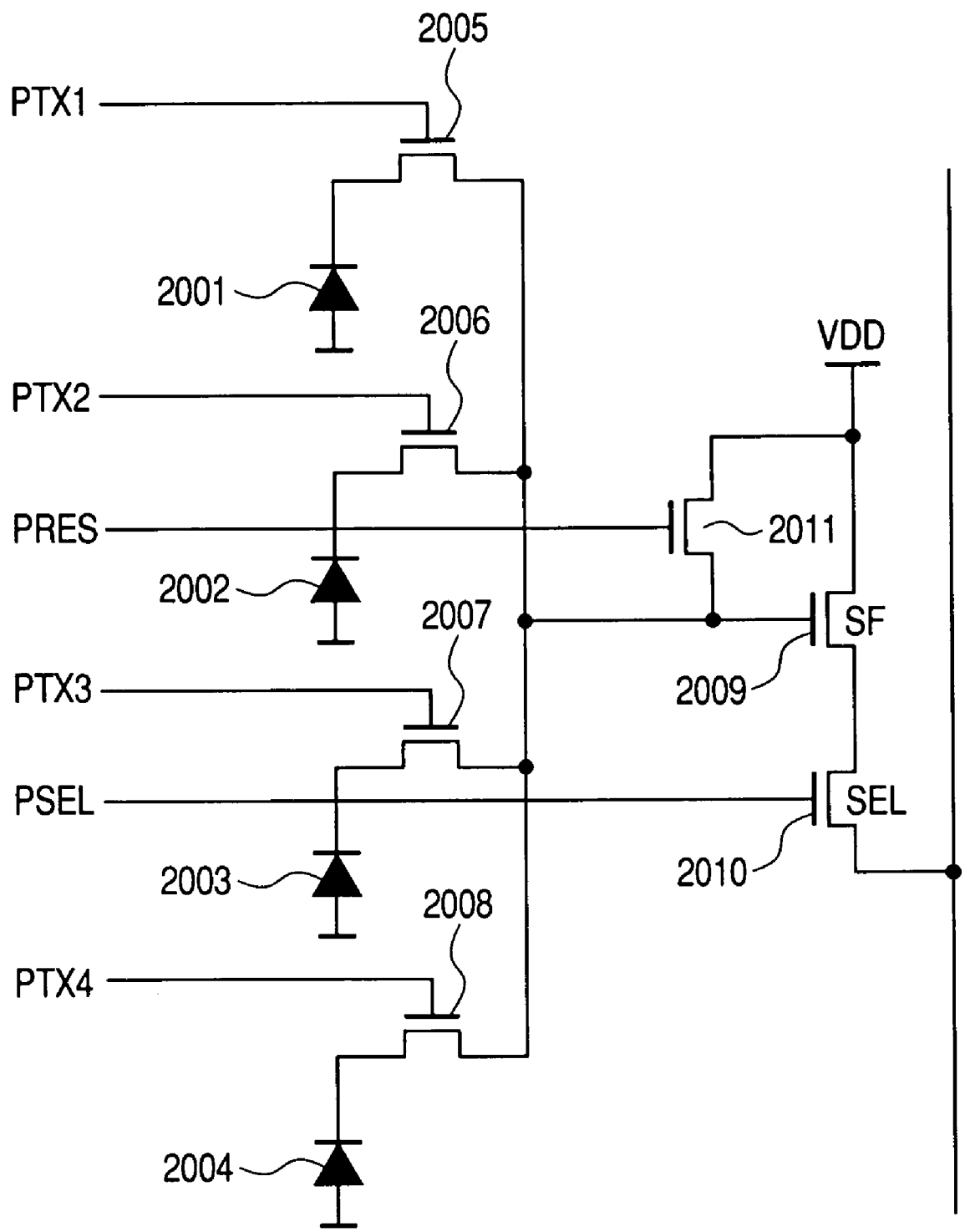
FIG. 12 is an equivalent circuit diagram showing a fifth embodiment of the present invention.
Figure 13:
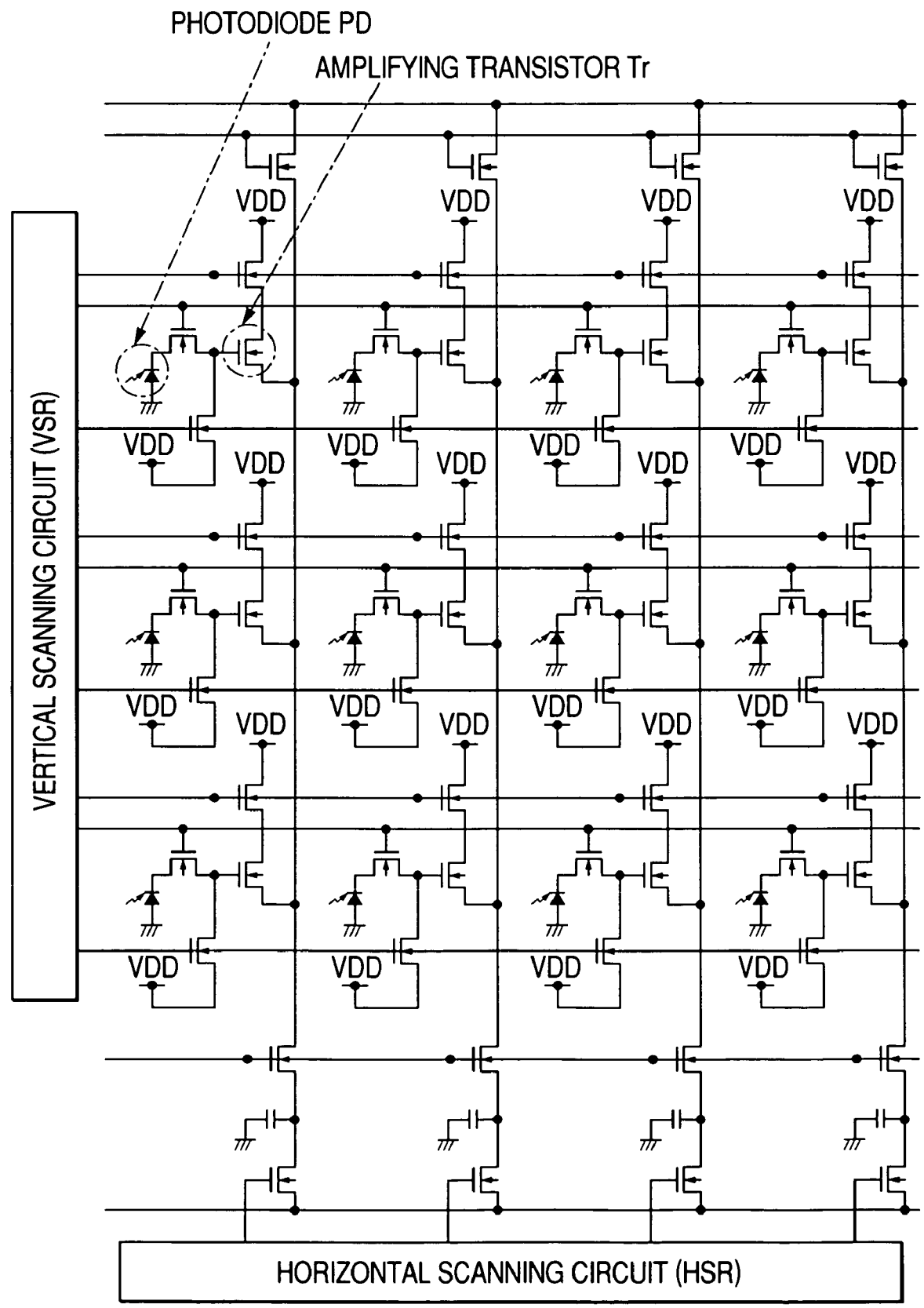
FIG. 13 is an equivalent circuit diagram showing a prior technology.
Figure 14:
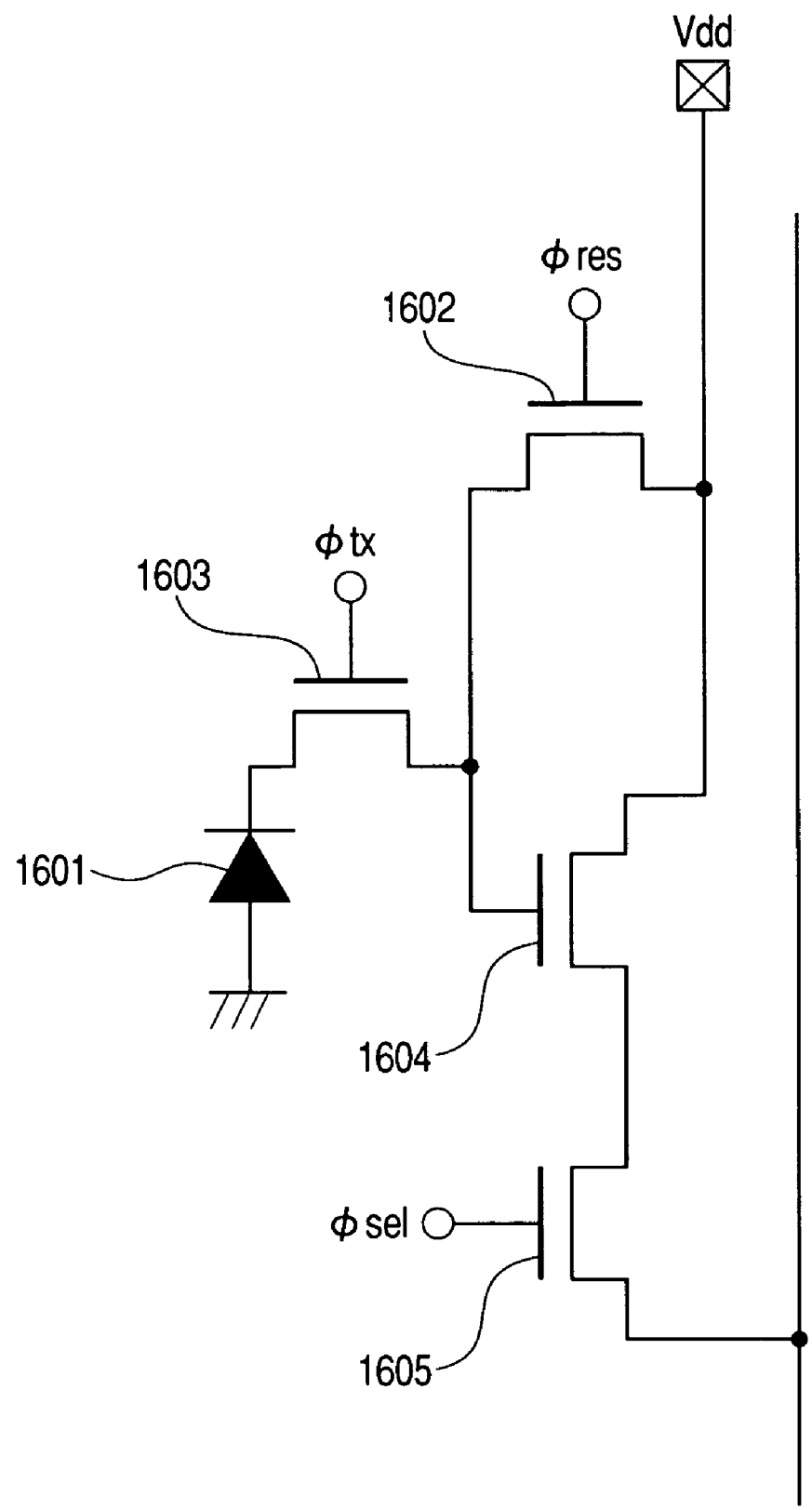
FIG. 14 is an equivalent circuit diagram showing a prior technology.
Figure 15:
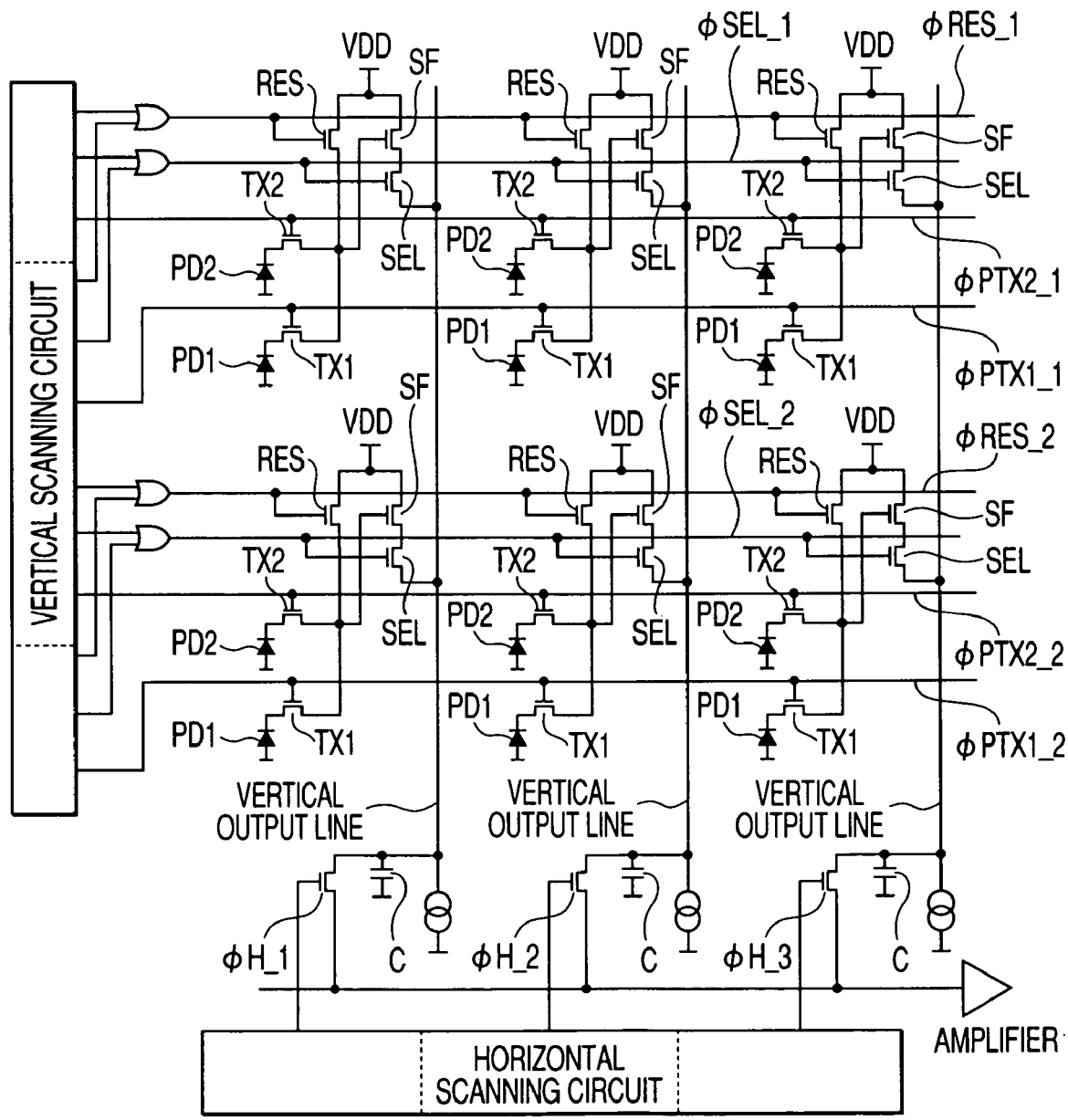
FIG. 15 is an equivalent circuit diagram showing a prior technology.
Figure 16:
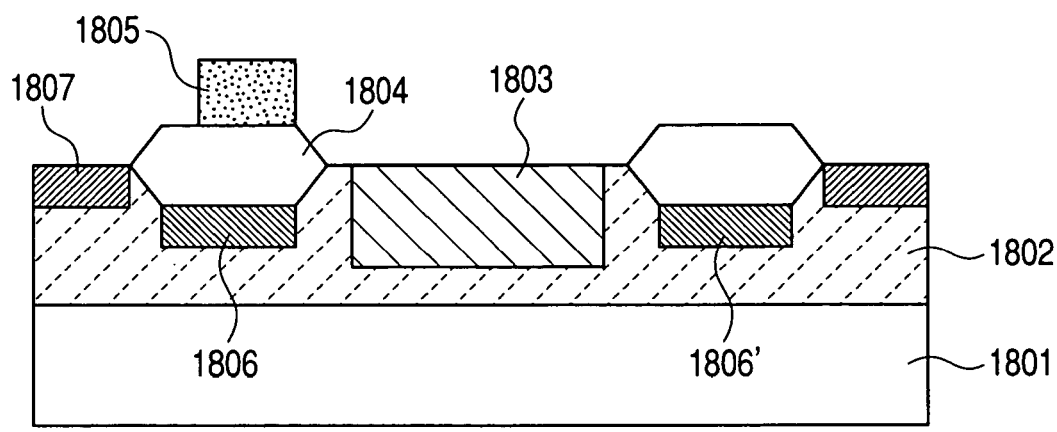
FIG. 16 is a cross-sectional view showing a prior technology.
Figure 17:
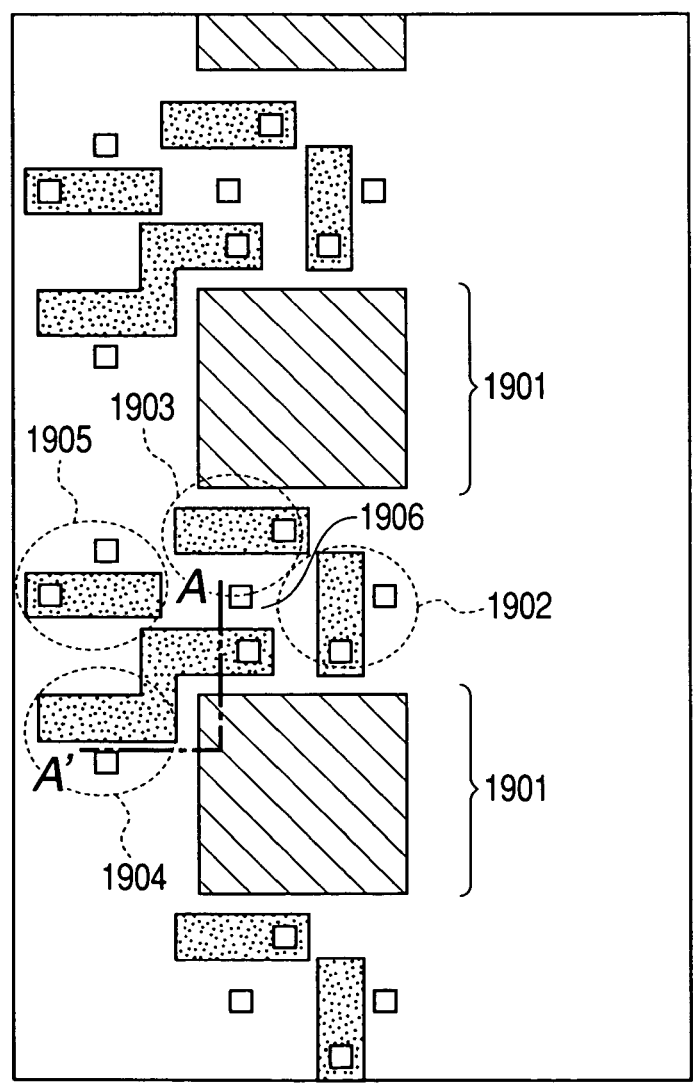
FIG. 17 is a plan view showing a prior technology.

FIG. 11 shows a pattern layout of an equivalent circuit diagram shown in FIG. 12, wherein same numbers indicate a same component. In FIG. 12, there are shown photodiodes 2001–2004, transfer MOS transistors 2005–2008, am amplifying MOS transistor (phosfollower) 2009 for amplifying the signals read from the MOS transistors 2001–2004, a selecting MOS transistor 2010 for selecting a row or a column, and a reset MOS transistor 2011.

In this configuration, signals obtained in four photodiodes are read in succession by controls lines (PTX1–PTX4) and amplified by an amplifier 2009 (source follower). This is so-called four-pixel common amplifier type, in which a resetting operation is executed by a reset MOS transistor 2011 and the signals area by a row selecting MOS transistor.

During an accumulation period, gates of the MOS transistors 2005–2008 are maintained at a low-level state, while gates of other MOS transistors (2009–2011 and 2012) are driven in a unified manner at a high- or low-level state as follows:

PTX1=PTX2=PTX3=PTX4=low

PSEL=PRES=PDUM=high or low.

In FIG. 11, there are shown a dummy gate POL 2012 and a dummy control line PDUM. These are provided, as in the first embodiment, in order that the amounts of the dark currents flowing into the photodiodes become uniform by the minority carriers generated under the POL wiring.

In the first embodiment, the fluctuation in the dark currents flowing into the photodiodes is controlled by the arrangement of MOS transistors, but, in the fifth embodiment, it is replaced by a dummy POL wiring, and an image of a satisfactory quality can also be obtained by this method.

Also an image of a further improved quality can be obtained by adding a dark current reducing area as shown in the third embodiment.

This application claims priorities from Japanese Patent Application Nos. 2004-228082 filed on Aug. 4, 2004, and 2005-204058 filed on Jul. 13, 2005, which are hereby incorporated by reference herein.

What is claimed is:

1. A solid-state image pickup apparatus having a pixel configuration including plural photodiodes and plural transistors and comprising a plurality of such pixels, wherein:
  the plural transistors include plural transfer transistors for respectively transferring signals from the plural photodiodes, a reset transistor for resetting the plural photodiodes, an amplifying transistor for converting the signal, transferred by the transfer transistors, into a voltage, and a selecting transistor for connecting output of the amplifying transistor to a common output line;

gates and wirings to the gates in at least two of the reset transistor, the amplifying transistor and the selecting transistor are adjacent to any one of the plural photodiodes; and the gate and the wiring to the gate in each of the transistors, adjacent to the photodiodes, have a same sum of length.

2. A solid-state image pickup apparatus according to claim 1, wherein, within the gate and the wiring to the gate in each of the transistors adjacent to the photodiodes, a portion assuming a high-level potential state during an accumulation period has a same length.

3. A solid-state image pickup apparatus according to claim 1, wherein a dark current reducing area is provided in a ladder shape along a direction of row or column.

4. A solid-state image pickup apparatus according to claim 3, wherein the dark current reducing area is not provided in a source-drain area of a transistor constituting a pixel.

5. A solid-state image pickup apparatus according to claim 3, wherein the dark current reducing area is not provided in a source-drain area of a transistor constituting a pixel but formed in a part of the photodiode, and a signal charge is held in the source-drain area.

6. A solid-state image pickup apparatus having a pixel configuration including two photodiodes and plural transistors and provided with a plurality of such pixels, wherein:

in each pixel, a first transistor adjacent to a first photodiode performs a function of resetting the photodiodes and a signal readout path;

a second transistor adjacent to a second photodiode performs a function of selecting a row;

a gate and a wiring in each of the first and second transistors respectively adjacent to the photodiodes have a same effective length; and the gate and the wiring in each of the first and second transistors respectively adjacent to the photodiodes have a same potential during an accumulation period.

7. A solid-state image pickup apparatus according to claim 6, wherein each of the first and second transistors have a same relative position to respectively adjacent photodiode.

8. A solid-state image pickup apparatus including plural photodiodes and plural transistors, wherein:

the plural transistors include:

plural transfer transistors for respectively transferring signals from the plural photodiodes;

a floating diffusion to which the signal is transferred by the transfer transistor;

a reset transistor for resetting the floating diffusion;

an amplifying transistor for converting the signal, transferred into the floating diffusion by the transfer transistors, into a voltage; and a selecting transistor for connecting output of the amplifying transistor to a common output line, and wherein gates and wirings to the gates in at least two of the reset transistor, the amplifying transistor and the selecting transistor are adjacent to any one of the plural photodiodes, and the gate and the wiring to the gate in each of the transistors, adjacent to the photodiodes, have a same sum of length.

9. The solid-state image pickup apparatus according to claim 1 or 8, wherein the amplifying transistor is provided commonly to the plural photodiodes.

10. The solid-state image pickup apparatus according to claim 1 or 8, wherein the reset transistor is provided commonly to the plural photodiodes.

* * * * *

UNITED STATES PATENT AND TRADEMARK OFFICE
CERTIFICATE OF CORRECTION

| | | |
|---|---|---|
| PATENT NO. | : 7,227,208 B2 | |
| APPLICATION NO. | : 11/190964 | |
| DATED | : June 5, 2007 | |
| INVENTOR(S) | : Masanori Ogura et al. | |

It is certified that error appears in the above-identified patent and that said Letters Patent is hereby corrected as shown below:

COLUMN 2:

Line 37, "Particular" should read --particular,--; and
    Line 46, "a drawback" should read --in a drawback--.

COLUMN 3:

Line 48, "transistor" should read --transistors--.

COLUMN 6:

Line 24, "in case the gate" should read --in a case where the gate--;
    Line 43, "the," should read --the--;
    Line 44, "transistor" should read --transistors--; and
    Line 67, "PD2)]=0.9-1" should read --PD2)]=0.9-1.1--.

COLUMN 7:

Line 9, "same" should read --the same--.

COLUMN 8:

Line 8, "501 having," should read --501, having--.

COLUMN 9:

Line 24, "same" should read --the same--;
    Line 50, "transferred," should read --transferred-- and
        "703a," should read --703a--; and
    Line 67, "thus" should read --this--.

COLUMN 10:

Line 33, "approximate same dark" should read --approximately the same dark--;
    Line 56, "same" should read --the same way as--; and
    Line 65, "also" should be deleted.

UNITED STATES PATENT AND TRADEMARK OFFICE
CERTIFICATE OF CORRECTION

PATENT NO. : 7,227,208 B2
APPLICATION NO. : 11/190964
DATED : June 5, 2007
INVENTOR(S) : Masanori Ogura et al.

It is certified that error appears in the above-identified patent and that said Letters Patent is hereby corrected as shown below:

COLUMN 11:

Line 18, "embodiment" should read --embodiments--;
Line 23, "is same" should read --is the same--;
Line 49, "is set" should be deleted; and
Line 63, "becomes" should read --become--.

COLUMN 12:

Line 18, "am" should read --an--;
Line 19, "(phosfollower)" should read --(source follower)--; and
Line 24, "controls" should read --control--.

Signed and Sealed this

Twenty-fifth Day of March, 2008

JON W. DUDAS
*Director of the United States Patent and Trademark Office*